(12) United States Patent
Ranganathan et al.

(10) Patent No.: US 11,549,900 B2
(45) Date of Patent: Jan. 10, 2023

(54) SENSOR ARRANGEMENT AND METHOD FOR SENSOR MEASUREMENT

(71) Applicant: ams International AG, Jona (CH)

(72) Inventors: Rohit Ranganathan, Eindhoven (NL); Ravi Kumar Adusumalli, Eindhoven (NL)

(73) Assignee: AMS INTERNATIONAL AG, Jona (CH)

(*) Notice: Subject to any disclaimer, the term of this patent is extended or adjusted under 35 U.S.C. 154(b) by 113 days.

(21) Appl. No.: 17/055,898

(22) PCT Filed: May 16, 2019

(86) PCT No.: PCT/EP2019/062676
§ 371 (c)(1),
(2) Date: Nov. 16, 2020

(87) PCT Pub. No.: WO2019/219842
PCT Pub. Date: Nov. 21, 2019

(65) Prior Publication Data
US 2021/0190712 A1    Jun. 24, 2021

(30) Foreign Application Priority Data
May 17, 2018 (EP) .................... 18172903

(51) Int. Cl.
*G01N 27/12* (2006.01)
*G01N 27/04* (2006.01)
(Continued)

(52) U.S. Cl.
CPC ......... *G01N 27/122* (2013.01); *G01N 27/045* (2013.01); *G01R 27/14* (2013.01); *H03M 1/0656* (2013.01)

(58) Field of Classification Search
CPC .... G01N 27/122; G01N 27/045; G01N 27/04; G01N 27/028; G01N 27/4162;
(Continued)

(56) References Cited

U.S. PATENT DOCUMENTS

| | | |
|---|---|---|
| 3,786,350 A | 1/1974 | Munt |
| 3,875,503 A | 4/1975 | Hayashi |

(Continued)

FOREIGN PATENT DOCUMENTS

| | | |
|---|---|---|
| EP | 3301437 A1 | 4/2018 |
| EP | 3447481 A1 | 2/2019 |

(Continued)

OTHER PUBLICATIONS

P. Ramanathan Nagarajan, B. George and V. J. Kumar, "An Improved Direct Digital Converter for Bridge-Connected Resistive Sensors," in IEEE Sensors Journal, vol. 16, No. 10, pp. 3679-3688, May 15, 2016, doi: 10.1109/JSEN.2016.2535666. (Year: 2016).*

(Continued)

*Primary Examiner* — Daniel R Miller
*Assistant Examiner* — Eric Sebastian Von Wald
(74) *Attorney, Agent, or Firm* — MH2 Technology Law Group LLP

(57) ABSTRACT

A sensor arrangement includes a switchable voltage source having a source output for alternatively providing a first and a second excitation voltage, an integrator having an integrator input and an integrator output, a sensor resistor having a first terminal coupled to the source output, a reference resistor having a first terminal coupled to a second terminal of the sensor resistor and a second terminal coupled to the integrator input, and a comparator having a first comparator input coupled to the integrator output.

14 Claims, 9 Drawing Sheets

(51) Int. Cl.
*G01R 27/14* (2006.01)
*H03M 1/06* (2006.01)

(58) Field of Classification Search
CPC ...... G01N 27/06; G01N 27/404; G01R 27/14; H03M 1/0656; H03M 1/52; H03M 1/1245; H03F 2203/21196; H03F 2200/264; H01H 9/0011; G06K 7/0082; H05K 1/0259; H05K 9/0067; H05K 1/0262; H01L 27/0248; H01L 2224/8011; H05F 1/00; H02H 3/353; H03J 9/007; H03K 17/16; H03K 19/17788; H03K 4/41; H03K 4/066; H03K 4/71; H04Q 2213/401; H02M 7/062; H03L 7/097; H05C 1/04

See application file for complete search history.

(56) References Cited

U.S. PATENT DOCUMENTS

| | | | |
|---|---|---|---|
| 4,169,708 A | 10/1979 | Muggli | |
| 4,908,623 A * | 3/1990 | Ullestad | H03M 1/129 341/118 |
| 5,184,500 A | 2/1993 | Krcma et al. | |
| 5,563,587 A | 10/1996 | Harjani | |
| 6,833,751 B1 | 12/2004 | Atrash | |
| 6,956,417 B2 | 10/2005 | Bernstein et al. | |
| 7,474,132 B2 | 1/2009 | Cheng | |
| 8,742,823 B2 | 6/2014 | Seth et al. | |
| 2002/0176067 A1 | 11/2002 | Charbon | |
| 2013/0088276 A1 | 4/2013 | Seth et al. | |
| 2013/0321378 A1 | 12/2013 | Jamal et al. | |
| 2015/0162929 A1 | 6/2015 | Shinozuka et al. | |
| 2017/0257097 A1 * | 9/2017 | Chiou | G01R 27/02 |

FOREIGN PATENT DOCUMENTS

| | | |
|---|---|---|
| JP | 52131447 A | 11/1977 |
| JP | 60069543 A | 4/1985 |

OTHER PUBLICATIONS

A. Ray and C. S. Anoop, "A Direct-Digitizer Interface Based on Dual-Slope Technique for Giant Magneto-Resistance Sensors," 2018 8th IEEE India International Conference on Power Electronics (IICPE), 2018, pp. 1-6, doi: 10.1109/IICPE.2018.8709500. (Year: 2018).*

Mohan et al. "Analysis of a Sigma-Delta Resistance-to-digital Converter for Differential Resistive Sensors," IEEE Transactions On Instrumentation and Measurement, vol. 58, No. 5, May 2009, 6 pages.

Radetic et al. "The Dual-Slope Conversion Improvement," Serbian Journal of Electrical Engineering, vol. 11, No. 3, Oct. 2014, 13 pages.

Barrettino et al. "CMOS Monolithic Metal-Oxide Gas Sensor Microsystems," IEEE Sensors Journal, vol. 6, No. 2, Apr. 2006, 11 pages.

Lombardi et al. "A Fully Integrated Interface Circuit for 1.5C Accuracy Temperature Control and 130dB Dynamic Range Readout of MOX Gas Sensors," IEEE Conference, Oct. 2008, 4 pages.

International Search Report and Written Opinion in corresponding International Application No. PCT/EP2019/062676 dated Aug. 27, 2019 10 pages.

Mancini, R. "Op Amps For Everyone" Texas Instruments, Advanced Analog Products, SLOD006B, Aug. 2002, 464 pages.

* cited by examiner

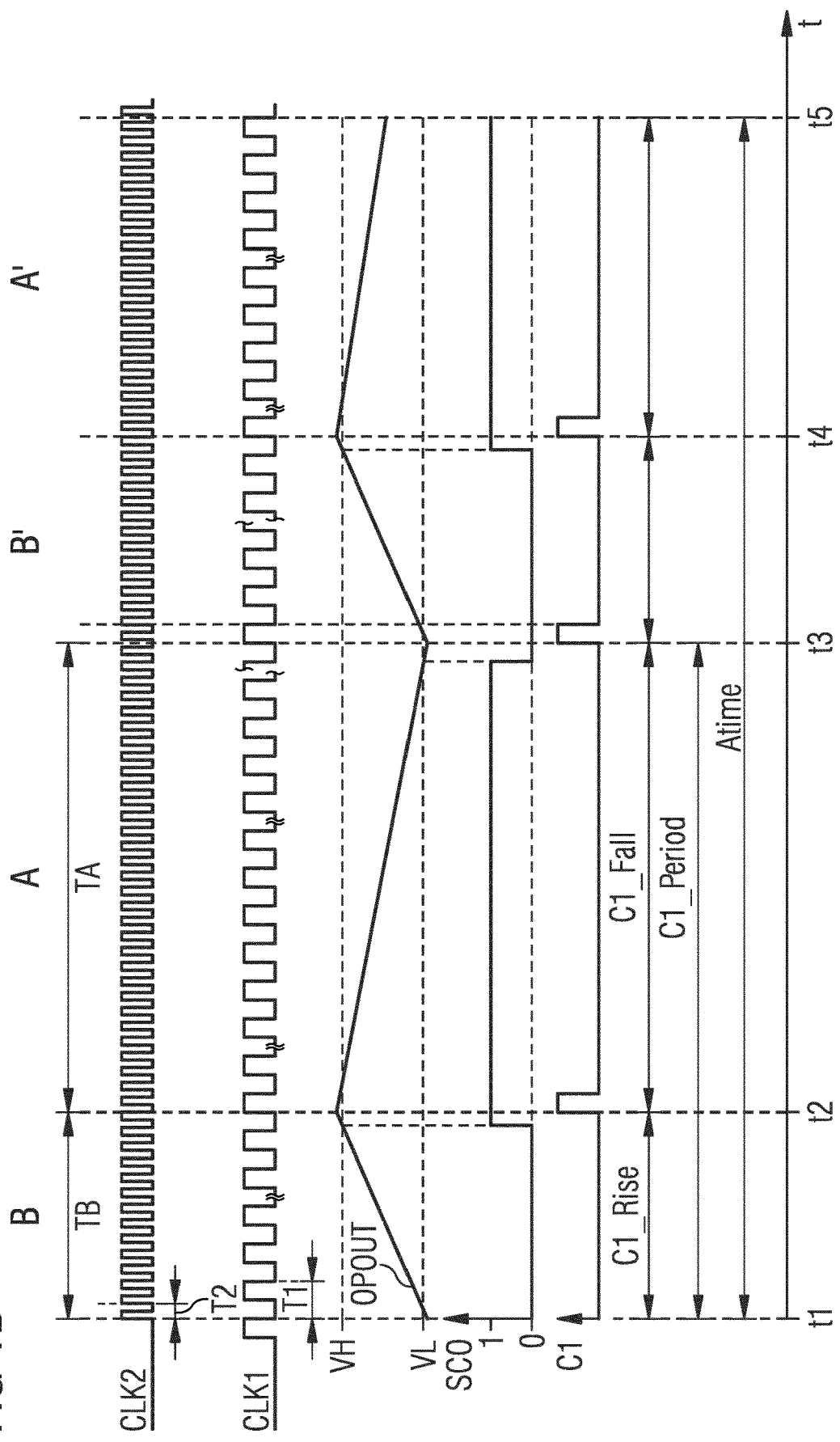

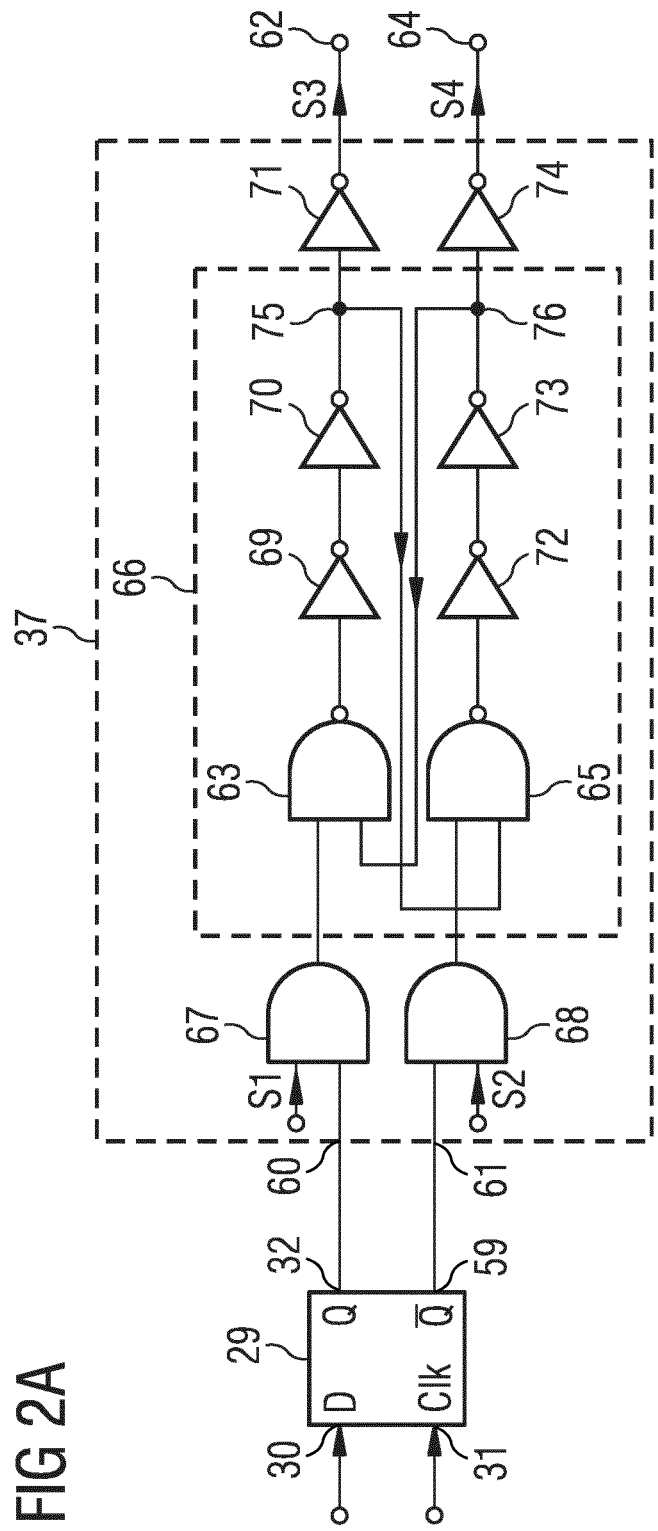

FIG 3

| RS (Input) | RS (Calculated) | | | |
|---|---|---|---|---|
| | RS_Tperiod | RS_Trise | RS_Tfall | |
| 10 | 10.22 | 8.076 | 12.36 | MΩ |
| 50 | 50.6 | 40.38 | 60.82 | MΩ |
| 100 | 101.1 | 80.76 | 121.4 | MΩ |
| 200 | 202 | 161.5 | 242.2 | MΩ |
| 300 | 303 | 242.3 | 363.7 | MΩ |

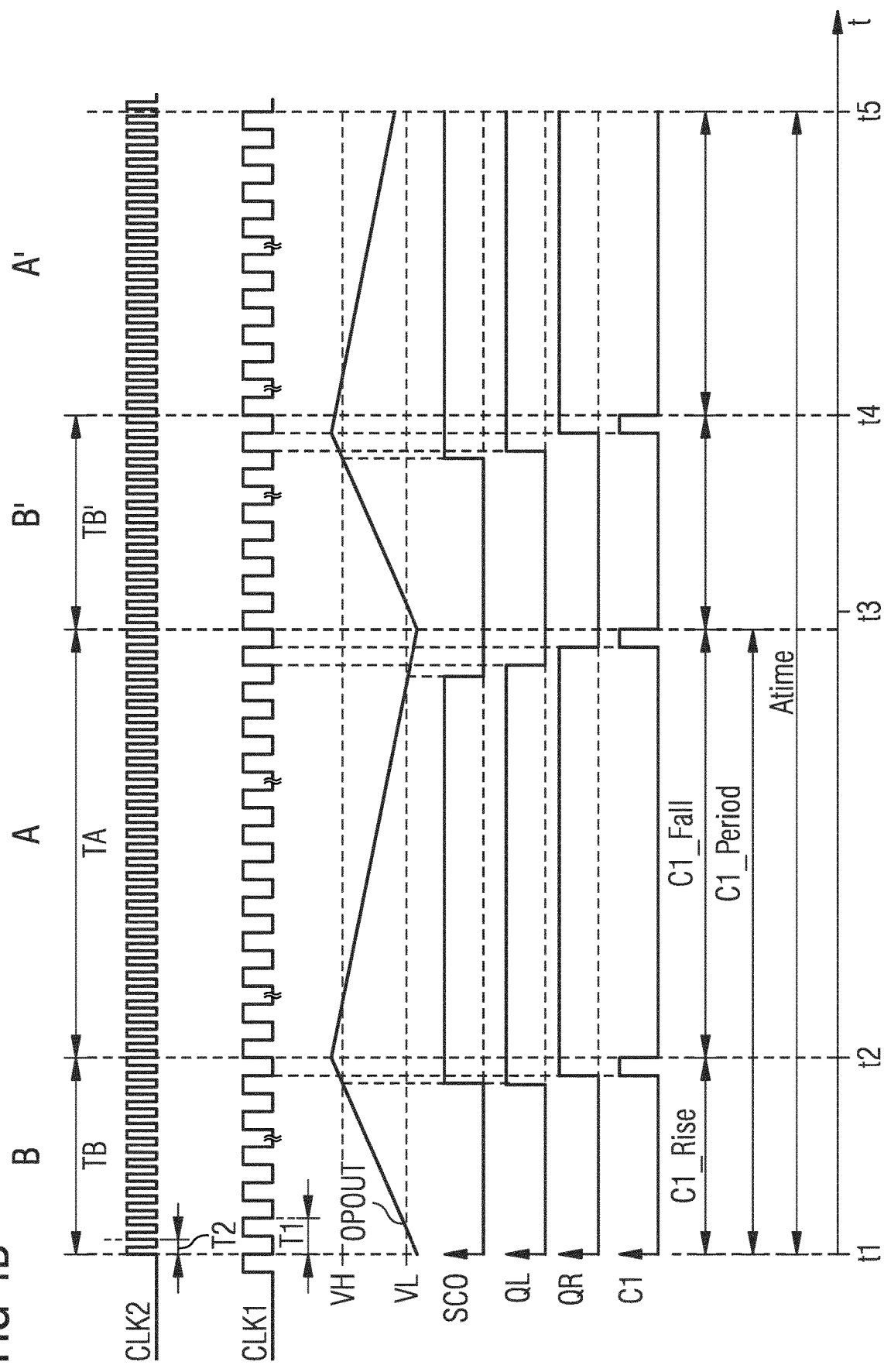

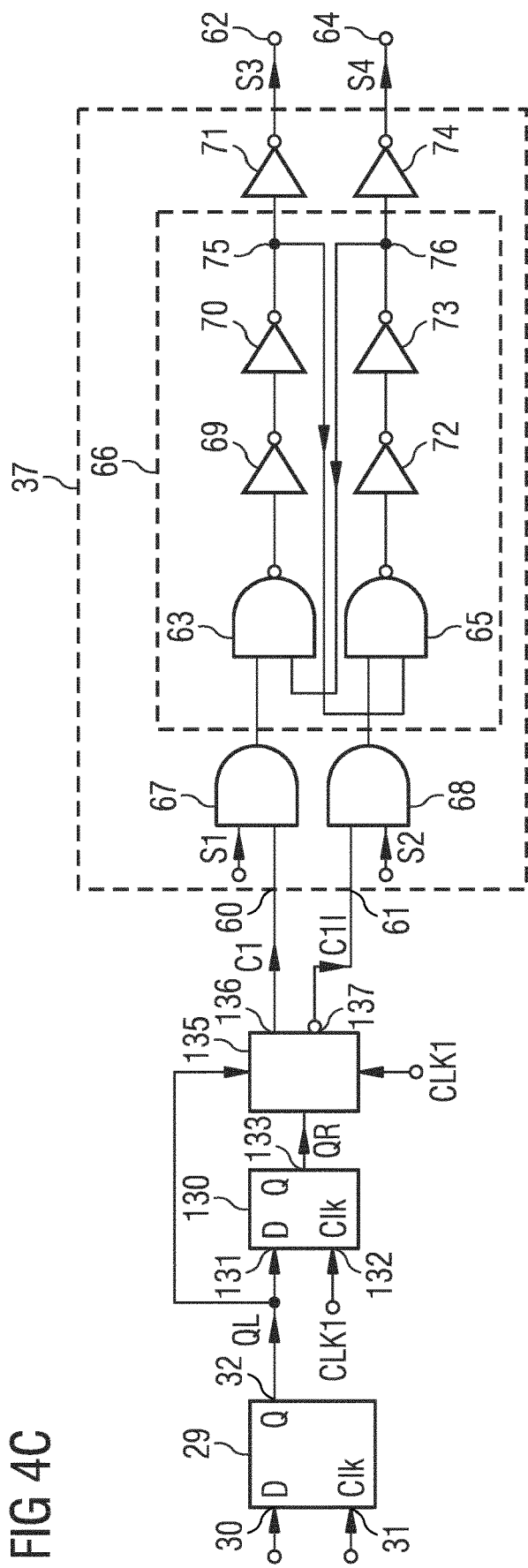

SENSOR ARRANGEMENT AND METHOD FOR SENSOR MEASUREMENT

BACKGROUND OF THE INVENTION

This disclosure is related to a sensor arrangement and to a method for sensor measurement.

A sensor often comprises a sensor resistor, whereas a resistance value of the sensor resistor depends on a parameter to be measured. A temperature sensor may comprise a sensor resistor having a resistance value depending on the temperature. Such a sensor resistor may comprise e.g. platinum as a temperature sensitive material. Also a gas sensor may comprise a sensor resistor, wherein the resistance value of the sensor resistor depends on a concentration of a gas. An example of such a sensor resistor is a metal oxide semiconductor resistor comprising $SnO_2$ or $ZnO$ as a gas sensitive material. The resistance value of the sensor resistor may obtain a high value depending on the gas concentration to be measured. There may be a leakage current from or to terminals of the sensor resistor resulting in an error of the gas sensor measurement.

SUMMARY OF THE INVENTION

This disclosure provides a sensor arrangement and a method for sensor measurement that reduces the influence of a leakage current.

The definitions as described above also apply to the following description unless otherwise stated.

In an embodiment, a sensor arrangement comprises a switchable voltage source having a source output for alternatively providing a first and a second excitation voltage, an integrator having an integrator input, a sensor resistor having a first terminal coupled to the source output, a reference resistor having a first terminal coupled to a second terminal of the sensor resistor and a second terminal coupled to the integrator input and a comparator having a first comparator input coupled to an integrator output of the integrator.

Advantageously, the source output of the switchable voltage source is directly connected to the first terminal of the sensor resistor. Thus, the first and the second excitation voltage are directly applied to the first terminal of the sensor resistor. The switchable voltage source is configured to provide the first and the second excitation voltage to the first terminal of the sensor resistor, optionally with a low output resistance. Thus, a leakage current flowing from the first terminal of the sensor resistor to any node of the sensor arrangement is directly provided by the switchable voltage source and has no influence on values of the first and the second excitation voltage and thus on the measurement of the resistance value of the sensor resistor.

In an embodiment, the sensor arrangement comprises a switch that couples the first terminal of the sensor resistor to the second terminal of the sensor resistor.

In an embodiment, the integrator comprises an amplifier having a first amplifier input coupled to the integrator input and an amplifier output coupled to the integrator output. The integrator comprises an integrating capacitor coupling the first amplifier input to the amplifier output.

In an embodiment, the switchable voltage source provides the first excitation voltage in a first phase and the second excitation voltage in a second phase. An integrator input current flows to the integrator input. The integrator input current has a different direction in the first phase in comparison to the second phase. The integrator input current changes its direction at transition from the first phase to the second phase and at transition from the second phase to a further first phase. The integrator input current is positive in one phase of the first and the second phase and is negative in the other phase of the first and the second phase.

In an embodiment, the comparator comprises a second comparator input to which a first and a second comparator reference voltage is alternatively provided. The second comparator input may be coupled to a further source output of the switchable voltage source.

In an embodiment, the sensor arrangement comprises a latch having a first latch input coupled to a comparator output of the comparator. The latch comprises a first latch output.

In an embodiment, the sensor arrangement comprises a logic circuit having an output. An input of the logic circuit is coupled to the first latch output of the latch. Alternatively, the input of the logic circuit is coupled to the comparator output of the comparator.

In an embodiment, the sensor arrangement comprises a calculation circuit that is coupled to the first latch output of the latch and/or to the output of the logic circuit. The calculation circuit may comprises a counter counting pulses provided at the first latch output. The calculation circuit may comprises an output for providing a result signal, e.g. a first digital signal and/or a second digital signal as a function of a value of the counter. The value of the counter may be named counter value.

In an embodiment, the sensor arrangement comprises a synchronous counter having a first counter input coupled to an output side of the latch and/or of the logic circuit. The first counter input may be coupled to the first latch output of the latch and/or to the output of the logic circuit. The synchronous counter may be configured to count pulses of a second clock signal starting from a pulse provided at the first latch output. An output of the synchronous counter may be coupled to the calculation circuit. Thus, the calculation circuit may comprises the output for providing the result signal, e.g. the first digital signal and/or the second digital signal as a function of a value of the counter of the calculation circuit and of a value of the synchronous counter.

In an embodiment, the sensor arrangement comprises a control logic coupled on its input side to an output side of the latch or the logic circuit and on its output side to the switchable voltage source. The input side of the control logic may be connected to the first latch output. The control logic may control or drive the switchable voltage source.

In an embodiment, the switchable voltage source comprises a buffer having an output coupled to the source output. The output of the buffer may be directly connected to the source output.

In an embodiment, the switchable voltage source comprises a voltage divider, a first switch that couples a first tap of the voltage divider to an input of the buffer and a second switch that couples a second tap of the voltage divider to the input of the buffer. The first excitation voltage is provided at the first tap and the second excitation voltage is provided at the second tap. When the first switch is set in a conducting state, then the first excitation voltage is provided via the buffer and the source output to the first terminal of the sensor resistor. When the second switch is set in a conducting state, then the second excitation voltage is provided via the buffer and the source output to the first terminal of the sensor resistor.

In an embodiment, the sensor arrangement comprises a bandgap circuit. The switchable voltage source comprises an amplifier circuit having an input coupled to an output of the bandgap circuit and an output coupled via the voltage divider to a reference potential terminal.

In an embodiment, a method for sensor measurement comprises
  alternatively providing a first and a second excitation voltage to a sensor resistor,
  integrating an integrator input current by an integrator, wherein the integrator input current flows through the sensor resistor and a reference resistor to an integrator input of the integrator,
  providing an integrator output voltage by the integrator and comparing the integrator output voltage by a comparator.

In an embodiment, this method is performed in a measurement mode of operation. A first digital signal is generated by the sensor arrangement in the measurement mode of operation. The first digital signal depends on the resistance value of the sensor resistor and the resistance value of the reference resistor. The first digital signal depends on the parameter to be measured such as a gas concentration.

In an embodiment, the first and the second excitation voltage is provided by a switchable voltage source to a first terminal of the sensor resistor. The reference resistor has a first terminal coupled to a second terminal of the sensor resistor and a second terminal coupled to the integrator input. A first comparator input of the comparator is coupled to an integrator output of the integrator.

In an embodiment, the first excitation voltage is provided to the sensor resistor in a first phase and the second excitation voltage is provided to the sensor resistor in a second phase. The integrator input current has a different direction in the first phase in comparison to the second phase.

In an embodiment, in a reference mode of operation, a switch is set in a conducting state that connects a first terminal of the sensor resistor to a second terminal of the sensor resistor. The first and the second excitation voltage is alternatively provided via the switch to the reference resistor. The integrator input current flows through the switch and the reference resistor to the integrator input.

In an embodiment, a second digital signal is generated by the sensor arrangement in the reference mode of operation. The second digital signal depends on the resistance value of the reference resistor. The second digital signal is independent of the resistance value of the sensor resistor. The resistance value of the sensor resistor can be determined as a function of the first and the second digital value.

The method for sensor measurement may be implemented e.g. by the sensor arrangement according to one of the embodiments defined above. The method for sensor measurement may be realized as method for operating the sensor arrangement.

In an embodiment, the sensor arrangement realizes a leakage compensated gas sensor. The sensor arrangement is implemented as a circuit that cancels the impact of an electrostatic discharge event, abbreviated ESD, and pad leakage for each measurement. A pad leakage is e.g. leakage current flowing at a bond pad, bond wire, flip-chip connection etc. This technique enables a wide-range gas-sensor front-end where the leakage current becomes e.g. comparable to (but less than) the signal current. Leakage cancellation is performed for each measurement. The method cancels leakage for process variation of leakage and temperature drift of the leakage. The sensor arrangement is e.g. a solution for a gas sensor. When the requirements are for a wide-range sensor resistance (>100 MΩ), the sensor current becomes smaller and smaller. The pad and ESD leakage may become comparable e.g. to the signal current. Also in this case, the sensor arrangement obtains a high measurement accuracy for a wide-range gas-sensor resistance where the leakage currents needs.

BRIEF DESCRIPTION OF THE DRAWINGS

The following description of figures of embodiments may further illustrate and explain aspects of the sensor arrangement and the method for sensor measurement. Devices and circuit parts with the same structure and the same effect, respectively, appear with equivalent reference symbols. In so far as devices or circuit parts correspond to one another in terms of their function in different figures, the description thereof is not repeated for each of the following figures.

FIGS. 1A to 1D show an example of an embodiment of a sensor arrangement;

FIGS. 2A and 2B show details of an example of an embodiment of a sensor arrangement;

FIG. 3 shows an example of simulation results achieved with a sensor arrangement; and FIGS. 4A to 4C show a further example of an embodiment of a sensor arrangement.

DETAILED DESCRIPTION

Figure 1A:
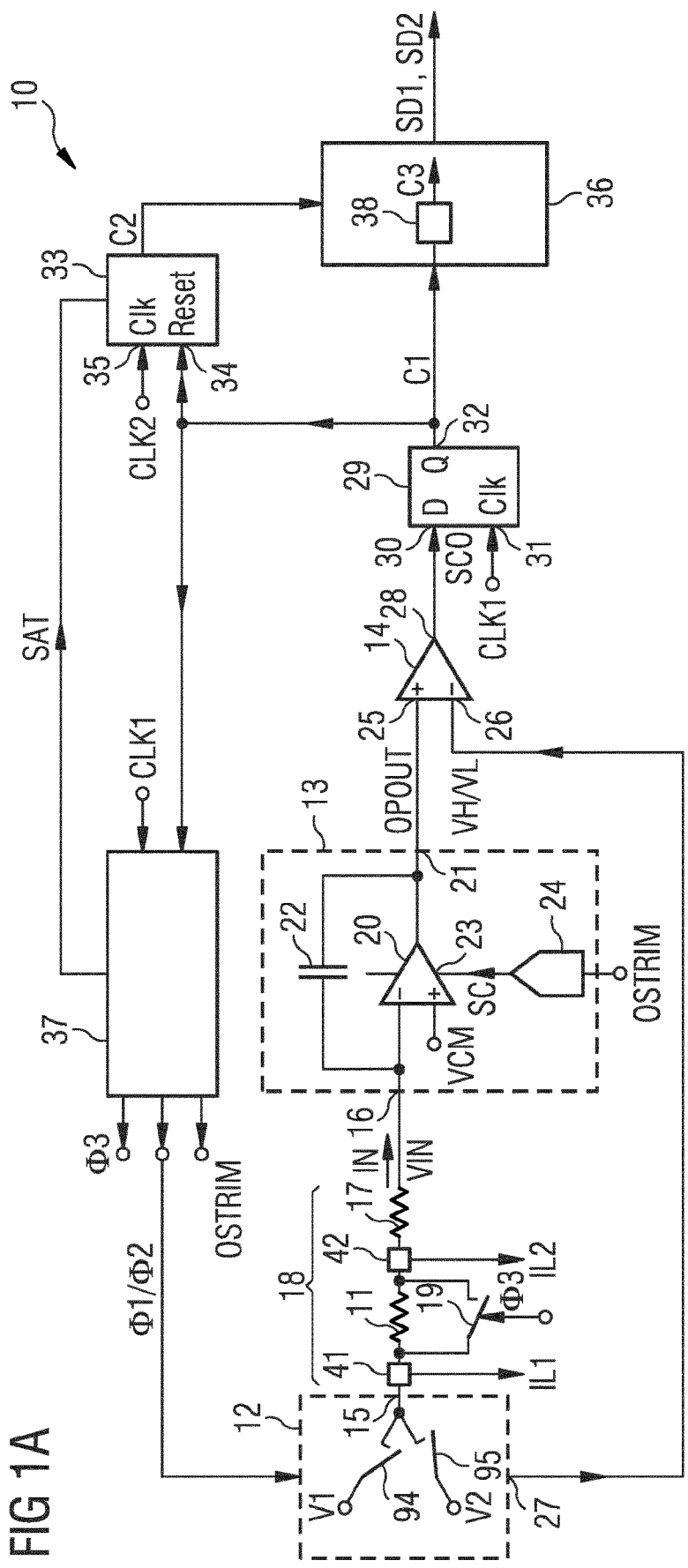

FIG. 1A shows an example of an embodiment of a sensor arrangement 10 comprising a sensor resistor 11, a switchable voltage source 12, an integrator 13 and a comparator 14. The sensor resistor 11 is arranged between a source output 15 of the switchable voltage source 12 and an integrator input 16 of the integrator 13. Moreover, the sensor arrangement 10 comprises a reference resistor 17. The sensor resistor 11 comprises a first and a second terminal 41, 42. The first terminal 41 of the sensor resistor 11 is directly and permanently connected to the source output 15. The second terminal 42 of the sensor resistor 11 is directly and permanently connected to a first terminal of the reference resistor 17. A second terminal of the reference resistor 17 is directly and permanently connected to the integrator input 16. The connection of the second terminal 42 of the sensor resistor 11 to the first terminal of the reference resistor 17 may comprise at least one of a group consisting of a connection line, a bond wire, a bond pad, a bump and a flip-chip connection. The connection of the first terminal 41 of the sensor resistor 11 to the source output 15 may comprise at least one of a group consisting of a connection line, a bond wire, a bond pad, a bump and a flip-chip connection.

The sensor resistor 11 and the reference resistor 17 form a series circuit 18. The series circuit 18 of the sensor resistor 11 and the reference resistor 17 is arranged between the source output 15 and the integrator input 16.

Furthermore, the sensor arrangement 10 comprises a switch 19 that connects the first terminal 41 of the sensor resistor 11 to the second terminal 42 of the sensor resistor 11. Thus, the series circuit 18 comprises the reference resistor 17 and a parallel circuit of the sensor resistor 11 and the switch 19.

The integrator 13 comprises an amplifier 20 having a first amplifier input coupled to the integrator input 16. The first amplifier input is directly and permanently connected to the integrator input 16 and thus to the second terminal of the reference resistor 17. Moreover, an amplifier output of the amplifier 20 is coupled to an integrator output 21. The integrator 13 comprises an integrating capacitor 22 that couples the integrator input 16 to the integrator output 21. The amplifier 20 comprises a control input 23. Moreover, the sensor arrangement 10 comprises a digital-to-analog converter 24 connected on its output side to the control input 23 of the amplifier 20. The integrator output 21 of the integrator 13 is coupled to a first comparator input 25 of the comparator 14. A second comparator input 26 of the comparator 14 may be coupled to a further source output 27 of the switchable voltage source 12.

The sensor arrangement 10 comprises a latch 29 having a first latch input 30 coupled to a comparator output 28 of the comparator 14. The first latch input 30 may be realized as a D-input. Moreover, the latch 29 may comprise a second latch input 31 that is connected to a clock generator, not shown. The second latch input 31 may be a clock input. The latch 29 comprises a first latch output 32. The first latch output 32 may be a Q output. The latch 29 may be realized as a D-latch, a D-flip-flop, and/or a transparent D-flip-flop.

The sensor arrangement 10 comprises a synchronous counter 33 having a first counter input 34 connected to the first latch output 32. The first counter input 34 may be realized as a reset input. The synchronous counter 33 has a second counter input 35 which is connected to a further clock oscillator, not shown. The synchronous counter 33 may be realized as a synchronized counter or a synchronization counter or, alternatively, be replaced by a counter.

Additionally, the sensor arrangement 10 comprises a calculation circuit 36. The calculation circuit 36 is connected on its input side to the first latch output 32. Moreover, the calculation circuit 36 is connected on its input side to an output of the synchronous counter 33. The calculation circuit 36 comprises a counter 38 which may be coupled to the first latch output 32.

Additionally, the sensor arrangement 10 comprises a control logic 37. The control logic 37 is connected on its input side to the first latch output 32. A further input of the control logic 37 is connected to a clock generator, not shown. The control logic 37 may comprise a clock generator. The control logic 37 is connected on its output side to a control terminal of the switch 19. The control logic 37 is connected on its output side to a control terminal of the digital-to-analog converter 24. Moreover, the control logic 37 is connected on its output side to the switchable voltage source 12.

The switchable voltage source 12 alternatively provides a first and a second excitation voltage V1, V2 at the source output 15. In a first phase A, the switchable voltage source 12 provides the first excitation voltage V1. In a second phase B, the switchable voltage source 12 provides the second excitation voltage V2. The first and the second excitation voltage V1, V2 are applied to the first terminal 41 of the sensor resistor 11. The first and the second excitation voltage V1, V2 are provided to the series circuit 18 of the sensor resistor 11 and the reference resistor 17.

In a measurement mode of operation, the switch 19 is set in a non-conducting state by a switch control signal Φ3. The control logic 37 generates the switch control signal Φ3. Thus, an integrator input current IN flows from the source output 15 to the integrator input 16 via the sensor resistor 11 and the reference resistor 17. At the integrator input 16 an integrator input voltage VIN can be tapped. The integrator input voltage VIN is applied to the first input of the amplifier 20.

During a reference mode of operation, the switch 19 is set in a conducting state by the switch control signal Φ3. Thus, the integrator input current IN flows from the source output 15 to the integrator input 16 via the switch 19 and the reference resistor 17.

A common mode voltage VCM is provided to the second input of the amplifier 20. The amplifier 20 generates an integrator output voltage OPOUT at the integrator output 21. The integrator output voltage OPOUT is a function of the integrator input current IN that flows through the reference resistor 17 to the integrator input 16. Due to the operation of the amplifier 20, the integrator input voltage VIN is approximately equal to the common mode voltage VCM. The control logic 37 provides a trim signal OSTRIM to the input of the digital-to-analog converter 24. The digital-to-analog converter 25 generates a control signal SC and provides it to the control input 23 of the amplifier 20 that is a function of the trim signal OSTRIM. A threshold of the amplifier 20 is set as a function of the control signal SC.

The integrator 13 provides the integrator output signal OPOUT to the first comparator input 25 of the comparator 14. A first and a second comparator reference voltage VH, VL is alternatively provided to the second comparator input 26. The first and the second comparator reference voltage VH, VL are generated by the switchable voltage source 12. The first comparator reference voltage VH is provided during the second phase B and the second comparator reference voltage VL is provided during the first phase A.

An output signal SCO of the comparator 14 is provided to the first latch input 30 of the latch 29. A first clock signal CLK1 is applied to the second latch input 31 of the latch 29. The latch 29 generates a first latch signal QL as a function of the comparator output signal SCO and of the first clock signal CLK1. The first latch signal QL may be equal to an output signal C1.

The output signal C1 is provided to the synchronous counter 33, the control logic 37 and the calculation circuit 36. The output signal C1 is provided to the first counter input 34 of the synchronous counter 33. A second clock signal CLK2 is applied to the second counter input 35 of the synchronous counter 33. The synchronous counter 33 generates a counter output signal C2 as a function of the second clock signal CLK2 and of the output signal C1. The output signal C1 performs a reset of the synchronous counter 33. The counter output signal C2 is provided to the calculation circuit 36. The synchronous counter 33 stops counting after receiving a signal SAT indicating the end of a conversion time Atime. Thus, the counter output signal C2 is generated at the end of the conversion time Atime. The counter output signal C2 is a function of or is equal to the number of pulses of the second clock signal CLK2 between a pulse of the output signal C1 and the end of a conversion time Atime.

The calculation circuit 36 calculates a first and/or second digital signal SD1, SD2. The first and/or second digital signal SD1, SD2 can also be called analog-to-digital converter counter result, abbreviated ADC_Count.

The output signal C1 and the first clock signal CLK1 are provided to the control logic 37. The control logic 37 generates control signals Φ1 to Φ3. The control signals Φ1 to Φ3 can also be called clock signals. The first and the second control signal Φ1, Φ2 are provided to the switchable voltage source 12. The switch control signal Φ3 is provided to the control terminal of the switch 19. The signals are further explained by FIGS. 1B to 1D.

The sensor arrangement 10 is fabricated as a circuit for pad/ESD leakage compensation for wide-range gas-sensor resistance measurement. The sensor arrangement 10 may operate with high accuracy as long as the leakage is less than a signal current ISIG or when the ESD/pad leakage becomes comparable to the signal current ISIG. The sensor resistance measurement has no significant error due to leakage current (not as much as the leakage is the percentage of the signal current ISIG).

Parts of the sensor arrangement 10 such as the reference resistor 17, the integrator 13 and the comparator 24 are fabricated on exactly one semiconductor body. The sensor resistor 11 may be realized separate from this semiconductor body. The sensor arrangement 10 can also be named sensor device or sensor apparatus. The sensor resistor 11 may be realized off-chip with respect to the semiconductor body.

Figure 4A:
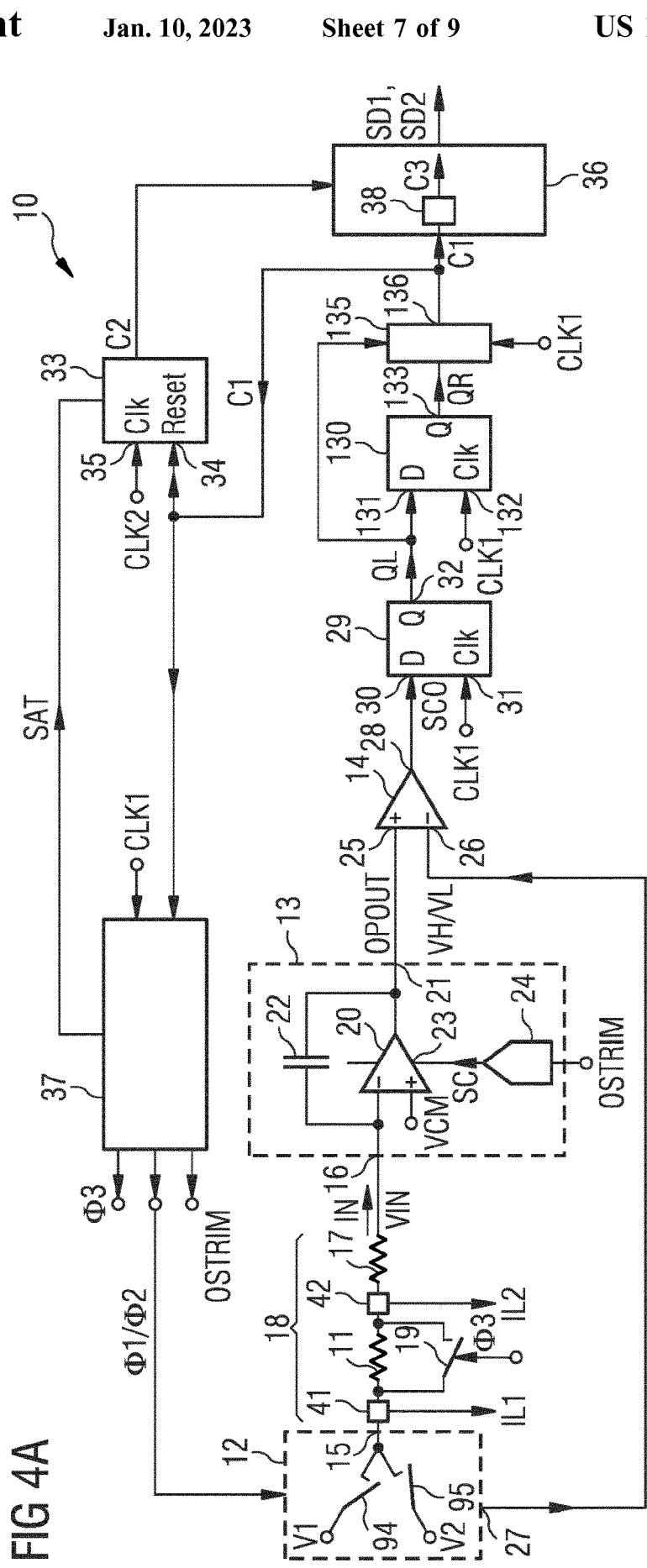

In an alternative embodiment, not shown, the sensor arrangement 10 comprises a logic circuit that is directly connected to the first latch output 32 of the latch 29 or is coupled to the first latch output 32 of the latch 29 e.g. by a further latch or another circuit, e.g. as shown in FIGS. 4A and 4C. The logic circuit generates the output signal C1. The logic circuit provides the output signal C1 by transferring a single pulse of the first clock signal CLK1 after a rising edge and additionally after a falling edge of the comparator output signal SCO. The output signal C1 is equal to a single pulse of the first clock signal CLK1 after a rising edge and after a falling edge of the comparator output signal SCO.

Alternatively, the input of the logic circuit may be coupled or directly connected to the comparator output 28 of the comparator 14. In this case the latch 29 may be omitted.

Alternatively, the switch 19 is omitted. Thus, the sensor resistor 11 is continuously measured in series connection with the reference resistor 17.

In an alternative embodiment, not shown the sensor arrangement 10 comprises a further comparator. The integrator output 21 of the integrator 13 is coupled to a first comparator input of the further comparator. The comparator 14 and the further comparator form a window comparator. The latch 29 or the logic circuit is coupled on its input side to a comparator output of the further comparator. A second comparator input of the further comparator may be coupled to an additional source output of the switchable voltage source 12. The second comparator reference voltage VL is continuously provided to the second comparator input of the further comparator. The first comparator reference voltage VH is continuously provided to the second comparator input 26 of the comparator 14. Thus, the integrator output voltage OPOUT is compared with the first and the second comparator reference voltage VH, VL either by the comparator 14 and the further comparator or only by the comparator 14 (as shown in FIG. 1A). Thus, the sensor arrangement 10 may be realized without switching the second comparator input 26 of the comparator 14 to different reference voltages. The second comparator input 26 receives a non-zero voltage.

Figure 1B:
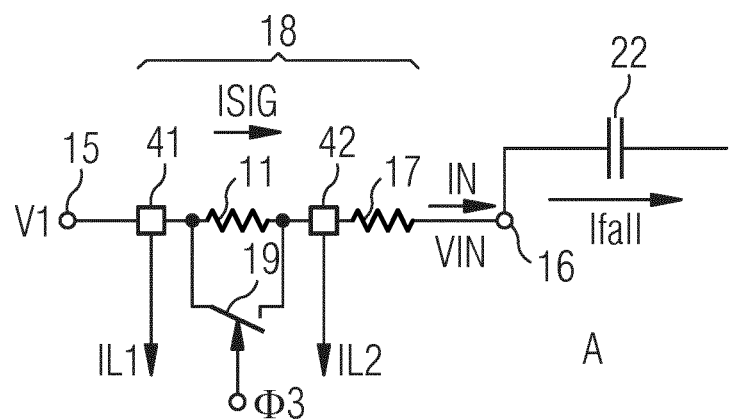

FIG. 1B shows an example of an embodiment of the sensor arrangement 10 shown in FIG. 1A in the first phase A. In the first phase A, the first excitation voltage V1 is provided to the sensor resistor 11. The first excitation voltage V1 can be calculated according to the equation:

$$V1 = VCM + VF,$$

wherein VCM is the common mode voltage and VF is a distance voltage. In the first phase A, the integrator input current IN is equal to a current Ifall. The integrator output voltage OPOUT falls during the first phase A. There may be a first leakage current IL1 at the first terminal 41 of the sensor resistor 11 and a second leakage current IL2 at the second terminal 42 of the sensor resistor 11. In FIG. 1B, the first and the second leakage current IL1, IL2 are indicated as arrows. Since the sensor resistor 11 is in contact with gas, such as air, and since air usually has a humidity content, leakage currents IL1, IL2 may flow from the terminals 41, 42 to other parts of the sensor arrangement 10. These leakage currents IL1, IL2 cannot be completely avoided, since an encapsulation of the sensor resistor 11 would result in an insensitive gas sensor.

The integrator input voltage VIN is approximately equal to the common mode voltage VCM. When there is no leakage, a signal current ISIG flows through the sensor resistor 11 and the reference resistor 17 that is given by:

$$ISIG = \frac{VF}{RS + RREF},$$

wherein RS is a resistance value of the sensor resistor 11 and RREF is a resistance value of the reference resistor 17. The above equation is valid in the measurement mode of operation. In the reference mode of operation, a resistance value of the switch 19 can be assumed as zero. Thus, the signal current ISIG follows the equation:

$$ISIG' = \frac{VF}{RREF},$$

wherein ISIG' is the value of the signal current in the reference mode of operation.

Figure 1C:
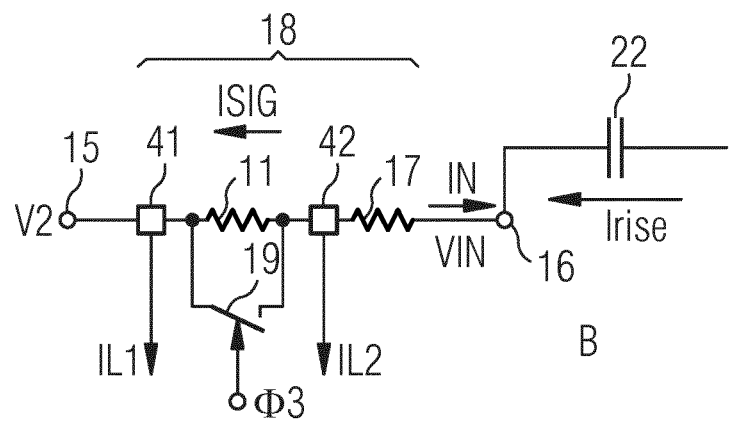

FIG. 1C shows an example of an embodiment of the sensor arrangement 10 in the second phase B. In the second phase B, the integrator input current IN has a negative value such that the integrator output voltage OPOUT rises. The second excitation voltage V2 can be calculated according to the following equation:

$$V2 = VCM - VF,$$

The first and the second excitation voltage V1, V2 are different. The first excitation voltage V1 is higher than the second excitation voltage V2. The common mode voltage VCM is between the first and the second excitation voltage V1, V2. The first and the second excitation voltage V1, V2 are forced on the first terminal 41 by a buffer 92 shown in FIG. 2B that can drive the first leakage current IL1 and maintain the excitation voltage forced. The other side of the sensor resistor 11 is an intermediate node that has the second leakage current IL2. The buffer 92 is realized as a voltage-reference operational amplifier. The currents Ifall and Irise (with the directions shown by arrows in FIGS. 1B and 1C) can be calculated according to the equations:

$$Ifall = ISIG - IL2 \text{ and } Irise = ISIG + IL2,$$

wherein ISIG is the signal current flowing through the sensor resistor 11. The direction of the signal current ISIG changes from the first to the second phase A, B.

FIG. 1D shows an example of signals of the sensor arrangement 10 of FIGS. 1A to 1C. The first clock signal CLK1 has a smaller frequency value than the second clock signal CLK2. The first clock signal CLK1 has a first period T1. The second clock signal CLK2 has a second period T2. The second period T2 is smaller than the first period T1. The first clock signal CLK1 e.g. may have a value of 1 MHz, whereas the second clock signal CLK2 may have a value of 4 MHz. The measurement of the resistance value of the sensor resistor 11 may be performed in the predetermined conversion time Atime, also called integration time.

A measurement may start with the second phase B. The first phase A and the second phase B alternate. A period consists of one first phase A and one second phase B. In the second phase B, the integrator output voltage OPOUT starts at the value of the second reference voltage VL at a first point of time t1. During the second phase B, the first comparator reference voltage VH is provided to the second comparator input 26. The comparator output signal SCO may have a first logical value, e.g. the value 0. The integrator output voltage OPOUT rises from the second comparator reference voltage VL to the first comparator reference voltage VH. At a second point of time t2 (or shortly before), the rising integrator output voltage OPOUT obtains the value of the first comparator reference voltage VH. Thus, the comparator output signal SCO changes its value. The comparator output signal SCO may have a second logical value, e.g. the value 1, at the second point of time t2. The latch 29 generates a pulse of the first latch signal QL (not shown) that results from the change of the value of the comparator output signal SCO and from the pulse of the first clock signal CLK1. A pulse of the output signal C1 is equal to or depends on the pulse of the first latch signal QL.

The synchronous counter 33 may be reset by the pulse of the output signal C1. The synchronous counter 33 may start counting pulses of the second clock signal CLK2. The synchronous counter 33 is reset e.g. at the first, second, third and fourth point of time t1, t2, t3, t4. Alternatively, the synchronous counter 33 may be reset optionally at some of these points of time, e.g. the first and the third point of time t1, t3. In one embodiment, the synchronous counter 33 may e.g. generate a pulse of the counter output signal C2 at the second point of time t2.

At the second point of time t2, the control logic 37 starts the first phase A and sets the phase signals Φ1, Φ2 such that the first excitation voltage V1 is provided to the series circuit 18 resulting in a fall of the integrator output voltage OPOUT. In the first phase A, the second comparator reference voltage VL is provided to the second comparator input 26. The integrator output voltage OPOUT is higher than the second comparator reference voltage VL up to a third point of time t3. The comparator output signal SCO may have the second logical value, e.g. the value 1, in the first phase A up to the third point of time t3 (or until shortly before the third point of time t3). At the third point of time t3 (or shortly before), the integrator output voltage OPOUT falls below the second comparator reference voltage VL such that the comparator output signal SCO changes its value, and may obtain e.g. the first logical value, e.g. the value 0. The latch 29 generates a pulse of the first latch signal QL that results from the change of the value of the comparator output signal SCO and from the pulse of the first clock signal CLK1. The pulse of the first latch signal QL triggers a pulse of the output signal C1. The pulse of the output signal C1 may rise with the rising edge of the pulse of the first clock signal CLK1. The pulses of the output signal C1 may rise with the rising edge of the pulses of the first clock signal CLK1.

The synchronous counter 33 may be reset by the pulse of the output signal C1. The synchronous counter 33 may start counting pulses of the second clock signal CLK2 after the reset. In an embodiment, the synchronous counter 33 may e.g. generate a pulse of the counter output signal C2. The first and the second comparator reference voltage VH, VL are different. The first comparator reference voltage VH is higher than the second comparator reference voltage VL. The second comparator reference voltage VL may be higher than the first excitation voltage V1. The first and the second comparator reference voltages VH, VL are different from the first and the second excitation voltages V1, V2.

A further second phase B' follows the first phase A and ends at a fourth point of time t4. The operation during the further second phase B' is equal to the operation in the previously described second phase B. A further first phase A' follows the further second phase B' and is between the fourth point of time t4 and a fifth point of time t5. The integrator output voltage OPOUT has a triangle form having a frequency depending on the resistance value of the sensor resistor 11.

In the example shown in FIG. 1D, the conversion time Atime ends during the further first phase A'. At the end of the conversion time Atime, the integrator output voltage OPOUT is between the first and the second comparator reference voltage VH, VL. The number of the first phases A, A' and the number of the second phases B, B' depends on the resistance value of the sensor resistor 11. FIG. 1D shows an example with two completed second phases B, B', one completed first phase A and one first phase A' stopped by the end of the conversion time Atime.

The counter 38 generates a counter value C3 which may be named course counter signal. In an embodiment, the counter 38 of the calculation circuit 36 counts the number of completed phases. The counter 38 of the calculation circuit 36 may count the number of the completed first phases A and the number of the completed second phases B, B', optionally in separate manner or in total. Alternatively, the counter 38 of the calculation circuit 36 may count only the number of completed periods.

The synchronous counter 33 may count the pulses of the second clock signal CLK2 from the start of the last phase up to the end of the conversion time Atime. The synchronous counter 33 may count the pulses of the second clock signal CLK2 from the start of the last second phase B, B' up to the end of the conversion time Atime, in case the conversion time starts with the second phase B. The synchronous counter 33 may count the pulses of the second clock signal CLK2 from the end of the last completed period up to the end of the conversion time Atime. The second clock signal CLK2 may be a function of or may be equal to the number of pulses of the second clock signal CLK2 during the uncompleted period. The uncompleted period ends with the end of the conversion time Atime.

In the measurement mode of operation, the switch 19 is set in a non-conducting state and the first digital signal SD1 is calculated using the counter value or values C3 of the counter 38 of the calculation circuit 36 and the counter output signal C2 of the synchronous counter 33. The counter value C3 of the counter 38 of the calculation circuit 36 represents a course result. The counter output signal C2 of the synchronous counter 33 represents a fine count, a residual count or a residual value of the integrator output voltage OPOUT. The first digital signal SD1 may be calculated using the number of the completed first phases A, A', the number of the completed second phases B, B' and the numbers of pulses in the last phase which is stopped by the end of the conversion time Atime. The first digital signal SD1 represents the resistance value of the series circuit 18 of the sensor resistor 11 and of the reference resistor 17. Thus, the first digital signal SD1 is a function of the counter value C3 and the counter output signal C2 determined in the measurement mode of operation: SD1=f(C3; C2).

In the reference mode of operation, the switch 19 is set in a conducting state and the second digital signal SD2 is determined such as the first digital signal SD1. Thus, the second digital signal SD2 is a function of the counter value C3 and the counter output signal C2 determined in the reference mode of operation: SD2=f(C3; C2). The function f is the same in both modes.

In FIG. 1D, the signal of the system or the architecture of FIG. 1A is shown. In the following, only the first phases A, A' are considered and the second phases B, B' are neglected (for example in case of an alternative sensor arrangement in which the integrator output voltage OPOUT is set from the second comparator reference voltage VL to the first comparator reference voltage VH at the end of each of the first phases A, A' using a charge package QP provided to the integrator input 16). The charge package QP may e.g. have the value:

$$QP = Cref \cdot Vref = Cref \cdot (VH-VL),$$

wherein Cref is a capacitance value of the integrating capacitor 22 and Vref is the difference between the first comparator reference voltage VH and the second comparator reference voltage VL. Considering the currents shown in FIG. 1B, a charge conservation at the integrator input 16 during the conversion time Atime results into the following equation:

$$(ISIG-IL2) \cdot Atime = Ctfall \cdot QP,$$

wherein Atime is a value of the conversion time, ISIG is a value of the signal current, IL2 is a value of the second leakage current, Ctfall is a value of a system count (such as SD1 or SD2) and QP is a value of the charge package. Using the above written equation, the system count Ctfall based on only the current Irise can be calculated according to the following equation:

$$Ct_{fall} = \frac{(ISIG - IL2) \cdot Atime}{QP} = \frac{(ISIG - IL2) \cdot Atime}{Cref \cdot Vref},$$

wherein ISIG is a value of the signal current, IL2 is a value of the second leakage current and Atime is a value of the conversion time. Here only first phases A are used.

Alternatively, only second phases B may be used and the first phases A, A' are neglected (for example in case of an alternative sensor arrangement in which the integrator output voltage OPOUT is set from the first comparator reference voltage VH to the second comparator reference voltage VL at the end of each of the second phases B, B' using the charge package QP defined above). Considering the currents shown in FIG. 1C, charge conservation results into the equation:

$$(ISIG+IL2) \cdot Atime = Ctrise \cdot QP,$$

wherein Ctrise is a value of a system count (such as SD1 or SD2) and Atime, ISIG, IL2 and QP are as defined above. Thus, the system count Ctrise using only the current Ifall can be calculated according to the following equation:

$$Ct_{rise} = \frac{(ISIG + IL2) \cdot Atime}{QP} = \frac{(ISIG + IL2) \cdot Atime}{Cref \cdot Vref}$$

If a system count Ctperiod is based on a period (rise+fall), the impact of leakage is cancelled. The system count corresponds to the first digital signal SD1. The first phases A, A' each may have a duration TA and the second phases B, B' each may have a duration TB. The conversion time Atime can be calculated for complete periods each consisting of one first phase A and one second phase B:

$$Atime = Ctperiod \cdot (TA+TB)$$

The integrator input current IN that flows during one duration TA results in the charge package QP. The integrator input current IN that flows during one duration TB also results in the charge package QP (or in −QP):

$$QP = TA(ISIG-IL2) \text{ and } QP = TB(ISIG+IL2)$$

Inserting TA and TB in the equation above results in:

$$Atime = Ctperiod \left( \frac{QP}{ISIG - IL2} + \frac{QP}{ISIG + IL2} \right)$$

Thus, the system count Ctperiod can be approximately calculated according to the following equation:

$$Ctperiod = \frac{Atime \, (ISIG^2 - IL2^2)}{2 \, QP \, ISIG} \approx \frac{Atime \, ISIG}{2 \, QP}$$

Since $IL2^2$ can be neglected in respect to $ISIG^2$, the system count Ctperiod and the digital signals SD1, SD2 are approximately independent from the leakage current IL2. Since the conversion time Atime and the charge package QP have predetermined values, the system count Ctperiod and the digital signals SD1, SD2 only depend on the signal current ISIG.

Moreover, the sensor arrangement 10 may be configured to realize a ratiometric measurement where
in a measurement mode of operation, the sensor resistor 11 and the reference resistor 17 are used, and
in a reference mode of operation, only the reference resistor 17 is used.

The first digital signal SD1 is generated by the calculation circuit 36 in the measurement mode of operation. The second digital signal SD2 is generated by the calculation circuit 36 in the reference mode of operation. A resistance value of the sensor resistor 11 can be calculated as a function of the first and the second digital signal SD1, SD2. The ratiometric measurement cancels other sources of error arising from the process errors and drifts e.g. of the switchable voltage source 12, the integrating capacitor 22 and the first and the second clock signal CLK1, CLK2 etc.

For the measurement of the sensor resistor 11 and the reference resistor 17, the impact of pad/ESD leakage is cancelled for count measurement $Ct_{period,RS+RREF}$ in the above suggested manner. The first and the second excitation voltage V1, V2 can be realized as VCM+/−VF. For the measurement of the reference resistor 17, the first and the second excitation voltage V1, V2 is directly forced on the second terminal 42 by the buffer 92 that can supply the leakage and maintain the first and the second excitation voltage V1, V2. Hence, there is no impact of ESD/pad leakage for the count measurement $Ct_{period,RREF}$.

In case different values AtimeS and AtimeR for the conversion time are set for the measurement mode of operation and for the reference mode of operation, the resistance value RS of the sensor resistor 11 may be calculated, e.g. by the calculation circuit 36, using:

$$RS = RREF * \left[ \frac{Ct_{period,RREF} \cdot AtimeS}{Ct_{period,RS+RREF} \cdot AtimeR} - 1 \right],$$

wherein RREF is the resistance value of the reference resistor 17, $Ct_{period,RREF}$ is the value of the second digital signal SD2 at the end of a conversion time AtimeR of the reference mode of operation, $Ct_{period,RS+RREF}$ is the value of the first digital signal SD1 at the end of a conversion time AtimeS of the measurement mode of operation, AtimeS is the duration of the conversion time of the measurement mode of operation and AtimeR is the duration of the conversion time of the reference mode of operation. $Ct_{period,RREF}$ has to be weighted with AtimeR and $Ct_{period,RS+RREF}$ has to be weighted by AtimeS to eliminate the influence of the different conversion times AtimeR, AtimeS.

In case AtimeR is equal to AtimeS, the system count $Ct_{period,RREF}$ may be much higher than the system count $Ct_{period,RS+RREF}$. Thus, the conversion time AtimeR in reference mode of operation can be set on a lower value in comparison to the conversion time AtimeS in the measurement mode of operation. Thus, a similar accuracy may be obtained for the determination of both system count values $Ct_{period,RREF}$ and $Ct_{period,RS+RREF}$. The above mentioned equation can be obtained as follows, wherein the leakage current IL2 is set to zero:

In the measurement mode of operation, the system count $Ct_{period,RS+RREF}$ can be calculated as follows using the above explained equation for Ctperiod and the equation ISIG=VF/(RS+REF):

$$Ctperiod, RS + REF = \frac{AtimeS \cdot ISIG}{2 \, QP} = \frac{AtimeS \cdot VF}{2 \, QP \, (RS + REF)}$$

In the reference mode of operation, the system count $Ct_{period,RREF}$ can be calculated using the above explained equation for Ctperiod and the equation ISIG'=VF/REF:

$$Ctperiod, REF = \frac{AtimeR \cdot ISIG'}{2 \, QP} = \frac{AtimeR \cdot VF}{2 \, QP \, REF}$$

Dividing the second equation through the first equation results in (QP and VF have the same values in the measurement mode and in the reference mode of operation):

$$\frac{Ctperiod, REF}{Ctperiod, RS + REF} = \frac{AtimeR \cdot (Rs + REF)}{REF \cdot AtimeS}$$

This results in the above mentioned equation for the resistance value RS of the sensor resistor 11.

In case the same value Atime for the conversion time is set for the measurement mode of operation and for the reference mode of operation, the resistance value RS of the sensor resistor 11 may be calculated, e.g. by the calculation circuit 36, using:

$$RS = RREF \left[ \frac{Ct_{period,RREF}}{Ct_{period,RS+RREF}} - 1 \right],$$

wherein RREF is the resistance value of the reference resistor 17, $Ct_{period,RREF}$ is the value of the second digital signal SD2 resulting from the reference mode of operation and $Ct_{period,RS+RREF}$ is the value of the first digital signal SD1 resulting from the measurement mode of operation. In the above equation, the conversion time Atime is fixed or predetermined or identical for the measurement mode and for the reference mode of operation. The same value for the conversion time Atime is set for the measurement mode of operation and for the reference mode of operation.

Advantageously, the sensor arrangement 10 realizes a wide-dynamic range gas-sensor architecture that can operate from 1 kΩ to 300 MΩ of the gas sensor. The ESD/pad leakage cannot introduce a significant measurement error for high resistance values of the sensor resistor 11. The sensor arrangement 10 can cancel the impact of ESD/pad leakage (as long as leakage is less than signal current) and process variations in leakage current or drift of signal/leakage current.

FIG. 2A shows an example of details of the sensor arrangement 10 shown in FIGS. 1A to 1D. The latch 29 and the control logic 37 are shown in detail. The latch 29 has a second latch output 59. The second latch output 59 is an inverse Q output. The control logic 37 comprises several logic gates. The control logic 37 comprises two inputs 60, 61 that are connected to the two latch outputs 32, 59. The control logic 37 comprises a flip-flop 66. A first NAND gate 63 of the flip-flop 66 is arranged between the first input 60 and a first terminal 62 of the control logic 37. Similarly, a second NAND gate 65 of the flip-flop 66 is arranged between the second input 61 and a second terminal 64. A first AND gate 67 of the control logic 37 couples the first input 60 to a first input of the first NAND gate 63. Correspondingly, a second AND gate 68 couples the second input 61 to a first input of the second NAND gate 65. A first signal S1 is applied to a second input of the first AND gate 67. A second signal S2 is provided to a second input of the second AND gate 68. The second input of the first AND gate 67 and the second input of the second AND gate 68 are connected to appropriate nodes of the sensor arrangement 10. The first and the second signal S1, S2 are signals to enable or disable this block, e.g. to enable or disable the flip-flop 66.

An output of the first NAND gate 63 is coupled by a series circuit of inverters 69 to 71 to the first terminal 62 of the control logic 37. The series circuit of inverters comprises three inverters 69 to 71. An output of the second NAND gate 65 is coupled e.g. by a series circuit of further inverters 72 to 74 to the second terminal 64 of the control logic 37. The series circuit of further inverters comprises three inverters 72 to 74. The output of the first NAND gate 63 is coupled via two inverters 69, 70 to a first node 75. The first node 75 is coupled via a third inverter 71 to the first terminal 62 of the control logic 37. The output of the second NAND gate 65 is coupled via two further inverters 72, 73 to a second node 76. The second node 76 is coupled via a further third inverter 74 to the second terminal 64 of the control logic 37.

The first node 75 is connected to a second input of the second NAND gate 65. The second node 76 is connected to a second input of the first NAND gate 63. A third signal S3 is provided at the first terminal 62 of the control logic 37. A fourth signal S4 is provided at the second terminal 64 of the control logic 37. The flip-flop 66 comprises the first and the second NAND gate 63, 65, the two inverters 69, 70, the two further inverters 72, 73 and the first and the second node 75, 76 together with the connections. The third and the fourth signal S3, S4 are used to generate the first and the second control D1, D2. The first and the second control D1, D2 are a function of the third and the fourth signal S3, S4. The third and the fourth signal S3, S4 realize non-overlap times for the sensor arrangement 10.

Figure 2B:
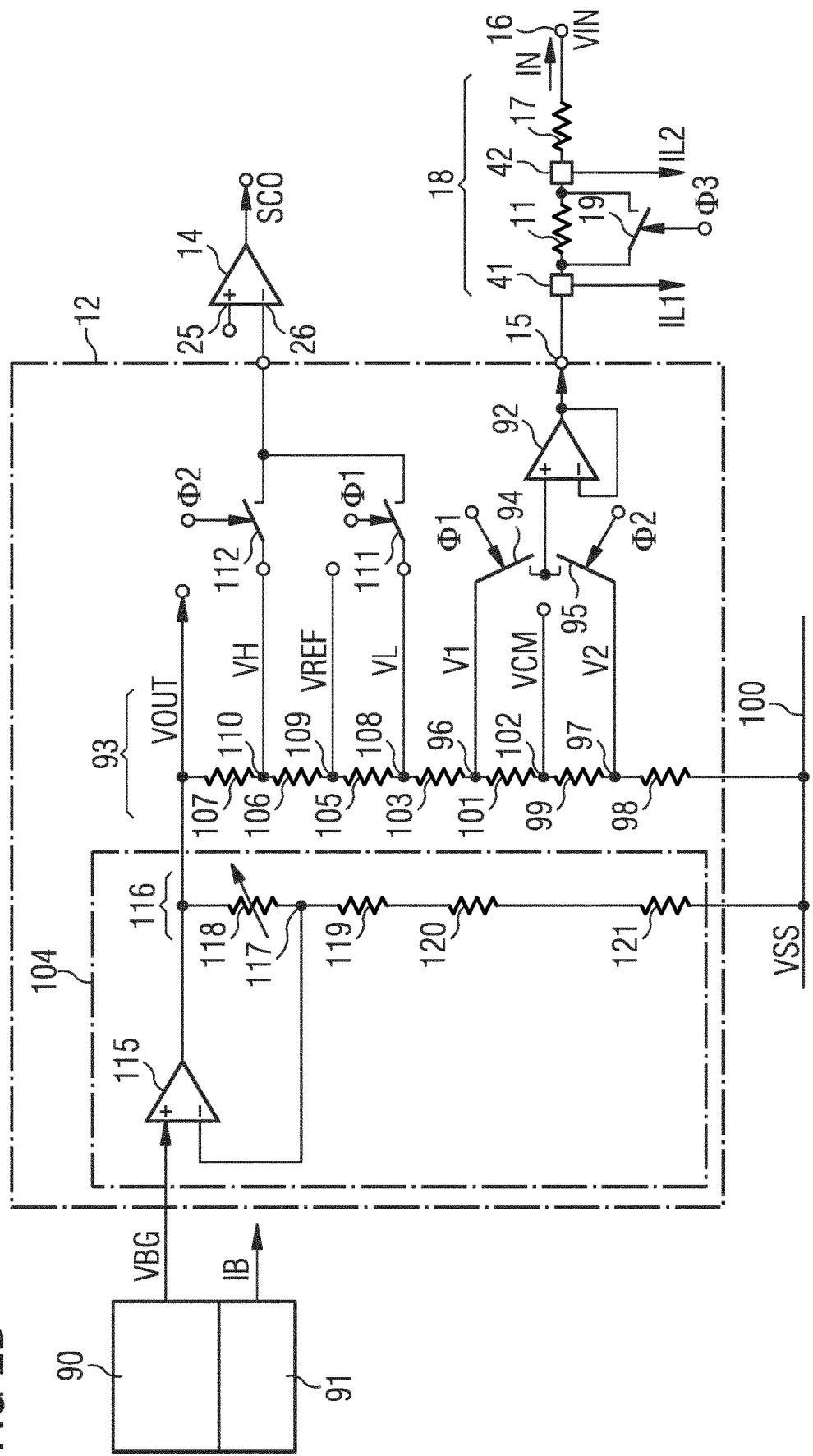

FIG. 2B shows an example of details of the sensor arrangement 10 shown in FIGS. 1A to 1D and 2A. The sensor arrangement 10 comprises a bandgap circuit 90. An output of the bandgap circuit 90 is coupled to an input of the switchable voltage source 12. Moreover, the sensor arrangement 10 comprises a current source 91 that is connected to the bandgap circuit 90 and has an output for providing a bias current IB.

The switchable voltage source 12 comprises a buffer 92. The buffer 92 has an output directly connected to the source output 15. Thus, the output of the buffer 92 is directly and permanently connected to the first terminal 41 of the sensor resistor 11. The buffer 92 is realized as an amplifier. An output of the amplifier forms the output of the buffer 92 and is directly connected to an inverting input of the amplifier. The buffer 92 may provide an amplification factor of 1.

Moreover, the switchable voltage source 12 comprises a voltage divider 93, a first switch 94 and a second switch 95. The first switch 94 couples a first tap 96 of the voltage divider 93 to an input of the buffer 92 that is connected to a non-inverting input of the amplifier of the buffer 92. The second switch 95 connects a second tap 97 of the voltage divider 93 to the input of the buffer 92. The voltage divider 93 is realized as a resistive voltage divider. The voltage divider 93 comprises a first and a second resistor 98, 99. The first resistor 98 couples the second tap 97 to a reference potential terminal 100. The second resistor 99 couples the first tap 96 to the second tap 97.

The voltage divider 93 may comprise a third resistor 101 such that the series circuit of the second and the third resistor 99, 101 couples the first tap 96 to the second tap 97. A third tap 102 is between the second and the third resistor 99, 101. The third tap 102 is connected to the second input of the amplifier 20 of the integrator 13. The voltage divider 93 at least comprises a fourth resistor 103 arranged between the first tap 96 and the output of the bandgap circuit 90.

Furthermore, the switchable voltage source 12 comprises an amplifier circuit 104. The amplifier circuit 104 is connected on its input side to the output of the bandgap circuit 90. An output of the amplifier circuit 104 is coupled via the voltage divider 93 to the reference potential terminal 100. The output of the amplifier circuit 104 is coupled via at least the fourth resistor 103 to the first tap 96. The voltage divider 93 may comprise a fifth to a seventh resistor 105 to 107. The series circuit of the fourth to the seventh resistor 103, 105 to 107 couples the first tap 96 to the output of the amplifier circuit 104. The voltage divider 93 comprises a fourth to a sixth tap 108 to 110. The fourth tap 108 is between the fourth resistor 103 and the fifth resistor 105. Similarly, the fifth tap 109 is between fifth resistor 105 and the sixth resistor 106. The sixth tap 110 is between the sixth resistor 106 and the seventh resistor 107. The fourth tap 108 is coupled via a third switch 111 to second comparator input 26. The sixth tap 110 is coupled via a fourth switch 112 to the second comparator input 26.

The amplifier circuit 104 comprises an operational amplifier 115 having a non-inverted input connected to the output of the bandgap circuit 90. An output of the operational amplifier 115 is connected to the output of the amplifier circuit 104. The amplifier circuit 104 comprises a further voltage divider 116. A tap 117 of the further voltage divider 116 is connected to an inverting input of the operational amplifier circuit 115. The further voltage divider 116 comprises a first resistor 118 and at least a second resistor 119. The first resistor 118 couples the output of the operational amplifier 115 to the tap 117. The second resistor 119 couples the tap 117 to the reference potential terminal 100. The further voltage divider 116 may comprise a third and a fourth resistor 120, 121 such that a series circuit of the second to the fourth resistor 117 to 121 couples the tap 117 to the reference potential terminal 100. Alternatively, the third and the fourth resistor 120, 121 of the further voltage divider 116 are replaced by connection lines.

The bandgap circuit 90 provides a bandgap voltage VBG that is applied to the input of the amplifier circuit 104 and such to the input of the operational amplifier 115. The amplifier circuit 104 generates an output voltage VOUT. The output voltage VOUT is a function of the bandgap voltage VBG and of the resistance values of the resistors of the further voltage divider 116. Thus, the output voltage VOUT has a higher voltage value than the bandgap voltage VBG. The amplification factor of the amplifier circuit 104 is higher than 1. The first resistor 118 and/or the second resistor 119 of the further voltage divider 116 can be realized as a trimmable resistor. A reference potential VSS is tapped at the reference potential terminal 100.

The output voltage VOUT drops across the voltage divider 93. Thus, at the first tap 96 of the voltage divider 93, the first excitation voltage V1 is generated. The first excitation voltage V1 is provided via the first switch 94 and the buffer 92 to the source output 15 in the first phase A. Correspondingly, at the second tap 97, the second excitation voltage V2 is generated. The second excitation voltage V2 is provided via the second switch 95 and the buffer 92 to the source output 15 in the second phase B. Advantageously, the buffer 92 supplies the first leakage current IL1 at the first terminal 41 of the sensor resistor 11. The common mode voltage VCM is tapped at the third tap 102 and provided to the second input of the amplifier 20 of the integrator 13.

At the fourth tap 108 of the voltage divider 93, the second comparator reference voltage VL is tapped and provided via the third switch 111 to the second comparator input 26 in the first phase A. Similarly, the first comparator reference voltage VH is tapped at the sixth tap 110 of the voltage divider 93 and provided via the fourth switch 112 to the second comparator input 26. At the fifth tap 109 of the voltage divider 93, a reference voltage VREF is tapped.

The values of the first and the second comparator reference voltage VH, VL are configured such that the gain of the conversion of the resistance value of the series circuit 18 into a digital value is set. A high gain results from a small difference between the first and the second comparator reference voltage VH, VL. Advantageously, different voltage values can be tapped from the same voltage divider 93. The voltage divider 93 is fabricated as a resistor divider.

FIG. 3 shows an example of a table illustrating simulation results of the sensor arrangement 10 shown above. A first column shows resistance values in MΩ that are selected for the sensor resistor 11. A second to a fourth column shows calculated resistance values of the sensor resistor 11 in MΩ. In the simulation for calculating the values of the second column the first phase A and the second phase B are used alternatively. In the third column and in the fourth column, the first phases A or the second phases B are omitted. Due to the high influence of the second leakage current IL2 the resistance values in the third and the fourth column deviate from the input resistance value shown in the first column and also from the resistance values in the second column By using the measurement method shown above, the deviation from the calculated resistance values of the sensor resistor 11 to the input resistance values can be kept small.

The above described sensor arrangement 10 was simulated for the measurement mode of operation and the reference mode of operation. The values the Trise, Tfall and Tperiod were measured for various resistance values of the sensor resistor 11 (10 MΩ, 50 MΩ, 100 MΩ, 200 MΩ and 500 MΩ). The chosen value of the leakage current IL2 was 20% of the signal current ISIG (leakage is modelled using a resistor Rleak that is five times the resistance value of the sensor resistor 11). The resistance value RS of the sensor resistor 11 is calculated by:

$$RS = RREF \cdot \left( \frac{Tperiod, RS + RREF}{Tperiod, RREF} - 1 \right)$$

Equations are the same since for a chosen integration time AtimeS (RS+RREF) and AtimeR (RS).

$$Ct_{period, RREF} = \frac{AtimeR}{Tperiod, RREF}$$

$$Ct_{period, RS+RREF} = \frac{AtimeS}{Tperiod, RS + RREF}$$

$$RS = RREF \cdot \left( \frac{AtimeS \cdot Ctperiod, RREF}{AtimeR \cdot CTperiod, RS + RREF} - 1 \right)$$

$$RS = RREF \cdot \left( \frac{AtimeS \cdot SD2}{AtimeR \cdot SD1} - 1 \right),$$

wherein RS is the resistance value of the sensor resistor 11, RREF is the resistance value of the reference resistor 17, SD1 is the value of the first digital signal, SD2 is the value of the second digital signal, AtimeS is the conversion time in the measurement mode of operation and AtimeR is the conversion time in the reference mode of operation.

The simulated results for the various resistance values of the sensor resistor 11 are shown in FIG. 3. According to the simulation, calculated resistance values of the sensor resistor 11 have less than 1% error when using Tperiod for calculation. Using Trise or Tfall introduces an error comparable to the fraction of the IL2/ISIG. In the above results, the error is ~20% that is same fraction of IL2/ISIG.

A change of the parameter to be measured (e.g. a gas concentration) is converted into a change of the resistance value RS of the sensor resistor 11 that is converted into a change of a frequency of the triangles of the integrator output voltage OPOUT that is converted into a change of the first digital signal SD1.

Thus, the sensor arrangement 10 realizes a high-accuracy gas sensor for wide dynamic range of operation (1 kΩ to 300 MΩ and higher). Pad/ESD leakage is compensated (ISIG>IL2) for/with the sensor arrangement 10. Leakage drift with temperature and other factors (supply, process) can also be compensated in the sensor arrangement 10.

FIG. 4A shows a further example of an embodiment of the sensor arrangement 10 that is a further development of the above shown embodiments, especially as shown in FIG. 1A. The sensor arrangement 10 comprises a logic circuit 135. An input of the logic circuit 135 is coupled to the first latch output 32 of the latch 29. An output 136 of the logic circuit 135 is connected to the calculation circuit 36, to the first counter input 34 of the synchronous counter 33 and to the control logic 37. The first clock signal CLK1 may be provided to the logic circuit 135. The logic circuit 135 provides the output signal C1 at the output 136 of the logic circuit 135.

The sensor arrangement 10 comprises a further latch 130. A first latch input 131 of the further latch 130 is coupled to the first latch output 32 of the latch 29. The first latch input 131 of the further latch 130 receives the first latch signal QL. A second latch input 132 of the further latch 130 receives the first clock signal CLK1. A latch output 133 of the further latch 130 is connected to a further input of the logic circuit 135. The further latch 130 generates a further latch signal QR at the latch output 133 of the further latch 130. The further latch 130 may be implemented as a D-latch, a D-flip-flop, and/or a transparent D-flip-flop. The further latch 130 may be realized such as the latch 29. The two latches 29, 130 may form a master-slave D flip-flop.

In an alternative embodiment, not shown, the further latch 130 is omitted. An input side of the logic circuit 135 is connected to the latch 29.

In an alternative embodiment, not shown, the latch 29 and the further latch 130 are omitted. An input side of the logic circuit 135 may be connected to the comparator 14 and, optionally, also to the further comparator.

FIG. 4B shows an example of signals of the sensor arrangement 10 of FIG. 4A which is a further development of the signals shown in FIG. 1D. The further latch signal QR is a function of the first latch signal QL and of the first clock signal CLK1. The logic circuit 135 receives the further latch signal QR of the further latch 130 and generates the output signal C1. The logic circuit 135 may receive the first latch signal QL of the latch 29. Thus, the logic circuit 135 may generate the output signal C1 using the first latch signal QL and the further latch signal QR.

The output signal C1 is generated after the rising edge and after the falling edge of the first latch signal QL by the logic circuit 135. Thus, the output signal C1 is generated at the rising edge and at the falling edge of the further latch signal QR by the logic circuit 135. A pulse of the output signal C1 may be generated e.g. by inverting the further latch signal QR and by performing a logical AND function of the inverted further latch signal QR and the first latch signal QL. For example, the pulses of the output signal C1 at the second and the fourth point of time t2, t4 may be generated in this manner Optionally, a further pulse of the output signal C1 may be generated e.g. by inverting the first latch signal QL and by performing a logical AND function of the inverted first latch signal QL and the further latch signal QR. For example, the pulse of the output signal C1 at the third point of time t3 may be generated in this manner. The logic circuit 135 uses the information provided by the two AND functions and shapes the output signal C1 according to the first clock signal CLK1.

The output signal C1 may have a pulse duration of 0.5 T1. A pulse of the output signal C1 may be between two pulses of the first clock signal CLK1, as shown in FIG. 4B. A pulse of the output signal C1 may rise with the falling edge of a pulse of the first clock signal CLK1. The logic circuit 135 may comprise not-shown NOR gates, NAND gates, inverters, delay circuits and other gates for performing the AND functions and for shaping the pulse of the output signal C1.

Alternatively, a pulse of the modified latch output signal C1 may be simultaneous to a pulse of the first clock signal CLK1. Thus, a pulse of the output signal C1 may rise with the rising edge of a pulse of the first clock signal CLK1.

FIG. 4C shows an example of details of the sensor arrangement 10 that is a further development of the above shown embodiments especially as shown in FIGS. 2A and 4A. The logic circuit 135 comprises a further output 137 that is coupled to the control logic 37. The first input 60 of the control logic 37 is connected to the output 136 of the logic circuit 135. The second input 61 of the control logic 37 is connected to the further output 137 of the logic circuit 135. The further output 137 is realized as an inverted output and provides a signal C1I. The signal C1I is the inverted signal of the output signal C1.

The embodiments shown in the FIGS. 1A to 4C as stated represent example embodiments of the improved sensor arrangement; therefore, they do not constitute a complete list of all embodiments according to the improved sensor arrangement. Actual sensor arrangement configurations may vary from the embodiments shown in terms of circuit parts, devices, structures and signals, for example.

The invention claimed is:

1. A sensor arrangement, comprising:
   a switchable voltage source having a source output for alternatively providing a first and a second excitation voltage;
   an integrator having an integrator input and an integrator output;
   a sensor resistor having a first terminal coupled to the source output;
   a reference resistor having a first terminal coupled to a second terminal of the sensor resistor and a second terminal coupled to the integrator input;
   a comparator having a first comparator input coupled to the integrator output; and
   a switch that couples the first terminal of the sensor resistor to the second terminal of the sensor resistor.

2. The sensor arrangement according to claim 1,
   wherein the integrator comprises:
     an amplifier having a first amplifier input and an amplifier output; and
     an integrating capacitor coupling the first amplifier input to the amplifier output.

3. The sensor arrangement according to claim 1,
   wherein the comparator comprises a second comparator input to which a first and a second comparator reference voltage is alternatively provided.

4. The sensor arrangement according to claim 1,
   comprising a latch having:
     a first latch input coupled to a comparator output of the comparator; and
     a first latch output.

5. The sensor arrangement according to claim 1,
   comprising a logic circuit having an output and having an input coupled to the first latch output of the latch or to the comparator output of the comparator.

6. The sensor arrangement according to claim 4,
   comprising a calculation circuit that is coupled to the first latch output of the latch and/or to the output of the logic circuit.

7. The sensor arrangement according to claim 4,
   comprising a synchronous counter having:
     a first counter input coupled to an output side of the latch and/or of the logic circuit; and
     an output coupled to the calculation circuit.

8. The sensor arrangement according to claim 4,
   comprising a control logic coupled on its input side to an output side of the latch or of the logic circuit and on its output side to the switchable voltage source.

9. The sensor arrangement according to claim 1,
   wherein the switchable voltage source comprises a buffer having an output coupled to the source output.

10. The sensor arrangement according to claim 9,
    wherein the switchable voltage source comprises:
      a voltage divider;
      a first switch that couples a first tap of the voltage divider to an input of the buffer; and
      a second switch that couples a second tap of the voltage divider to the input of the buffer.

11. The sensor arrangement according to claim 10,
    wherein the sensor arrangement comprises a bandgap circuit and the switchable voltage source comprises an amplifier circuit having an input coupled to an output of the bandgap circuit and an output coupled via the voltage divider to a reference potential terminal.

12. A method for sensor measurement, comprising:
    alternatively providing a first and a second excitation voltage to a sensor resistor;
    integrating an integrator input current by an integrator, wherein the integrator input current flows through the sensor resistor and a reference resistor to an integrator input of the integrator;
    providing an integrator output voltage by the integrator; and
    comparing the integrator output voltage by a comparator,
    wherein a switch connects a first terminal of the sensor resistor to a second terminal of the sensor resistor.

13. The method according to claim 12,
    wherein the first excitation voltage is provided to the sensor resistor in a first phase and the second excitation voltage is provided to the sensor resistor in a second phase, and
    wherein the integrator input current has a different direction in the first phase in comparison to the second phase.

14. The method according to claim 12,
    wherein in a reference mode of operation, the switch is set in a conducting state,
    wherein the first and the second excitation voltage is alternatively provided to the switch, and
    wherein the integrator input current flows through the switch and the reference resistor to the integrator input.

* * * * *